US011831338B2

(12) United States Patent
Eroz et al.

(10) Patent No.: US 11,831,338 B2
(45) Date of Patent: Nov. 28, 2023

(54) SYSTEMS AND METHODS FOR IMPROVING COMMUNICATION THROUGHPUT

(71) Applicant: Hughes Network Systems, LLC, Germantown, MD (US)

(72) Inventors: Mustafa Eroz, Germantown, MD (US); Lin-nan Lee, Germantown, MD (US); Victor Liau, Germantown, MD (US); Glenn Robins, Germantown, MD (US)

(73) Assignee: HUGHES NETWORK SYSTEMS, LLC, Germantown, MD (US)

( * ) Notice: Subject to any disclaimer, the term of this patent is extended or adjusted under 35 U.S.C. 154(b) by 0 days.

(21) Appl. No.: 17/843,698

(22) Filed: Jun. 17, 2022

(65) Prior Publication Data

US 2023/0261674 A1 Aug. 17, 2023

Related U.S. Application Data

(60) Provisional application No. 63/301,835, filed on Jan. 21, 2022.

(51) Int. Cl.
*H03M 13/00* (2006.01)
*H03M 13/27* (2006.01)

(52) U.S. Cl.
CPC .............. *H03M 13/2732* (2013.01)

(58) Field of Classification Search
CPC ........... H03M 13/116; H03M 13/2778; H03M 13/2757; H03M 13/2936; H03M 13/27; H03M 13/2732
See application file for complete search history.

(56) References Cited

U.S. PATENT DOCUMENTS

| | | | |
|---|---|---|---|
| 6,629,287 B1* | 9/2003 | Brink ................ | H03M 13/2972 714/755 |
| 6,658,605 B1* | 12/2003 | Yoshida .................. | H03M 7/30 714/755 |
| 6,810,502 B2* | 10/2004 | Eidson .................. | H04L 1/0066 714/792 |
| 9,917,715 B2* | 3/2018 | Ko ......................... | H04L 27/122 |
| 10,374,632 B2* | 8/2019 | Zhang ............... | H03M 13/2957 |
| 10,826,539 B2* | 11/2020 | Xi .......................... | H04L 1/1671 |

* cited by examiner

*Primary Examiner* — Esaw T Abraham
(74) *Attorney, Agent, or Firm* — GLOBAL IP COUNSELORS, LLP

(57) ABSTRACT

Communication terminals, systems and methods are disclosed herein. In an embodiment, a method for improving communication throughput when experiencing periodic blockages includes reading a plurality of data elements into an interleaver in one of a quasi-reverse order and a consecutive order, reading the plurality of data elements out of the interleaver in the other of the quasi-reverse order and the consecutive order, and. transmitting the plurality of data elements via a communication channel that experiences periodic blockages.

13 Claims, 9 Drawing Sheets

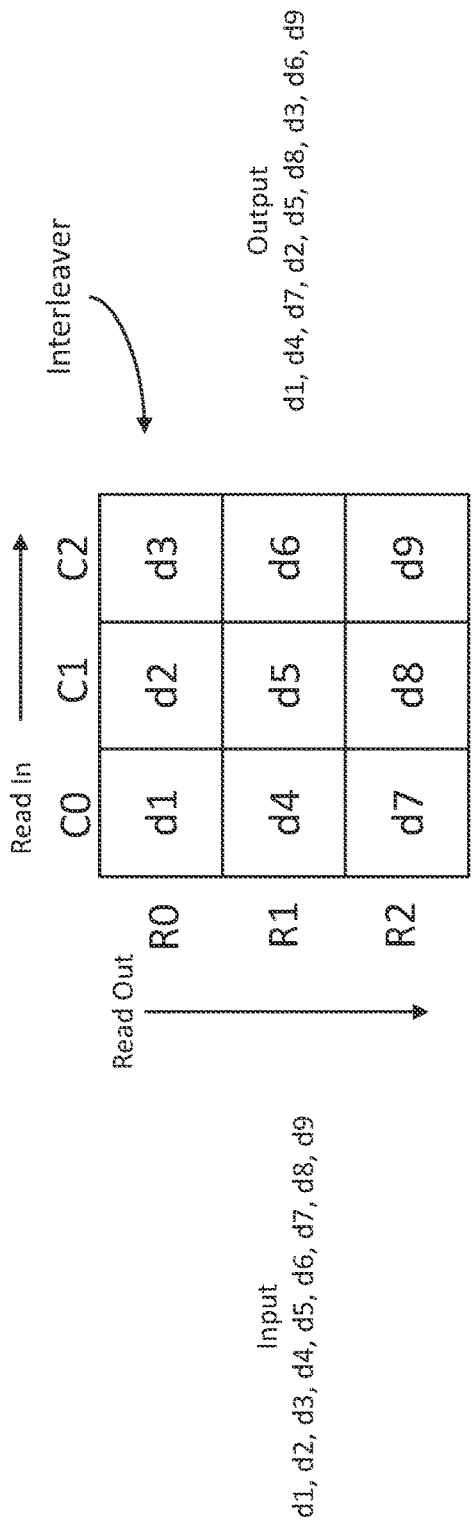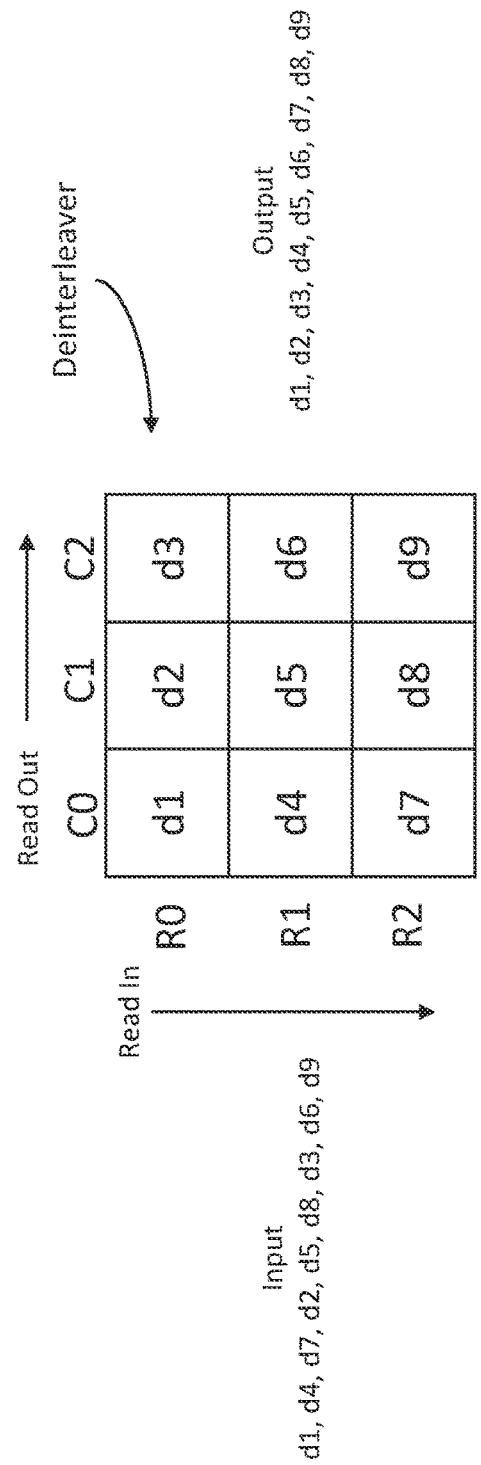
FIG. 3A
FIG. 3B

SYSTEMS AND METHODS FOR IMPROVING COMMUNICATION THROUGHPUT

CROSS REFERENCE TO RELATED APPLICATIONS

This application claims priority to Provisional Application No. 63/301,835, filed. Jan. 21, 2022, entitled "A Concatenated Error Control Coding Design for Periodically Blocked Channels", the entire contents of which is incorporated herein by reference and relied upon.

FIELD OF THE INVENTION

The present disclosure is directed to systems and methods for improving communication throughput. More specifically, the present disclosure is directed to systems and methods for improving communication throughput when experiencing periodic blockages.

BACKGROUND INFORMATION

Transmissions between a transmitter and a receiver can be subject to recurring blockages. For example, the transmitter and the receiver on a helicopter's satellite communication terminal can be periodically blocked by the helicopter's rotating blades. The blocked data can be corrupted, requiring error corrections or retransmissions, which can take time and require excess bandwidth and processing power.

SUMMARY

The present disclosure provides a concatenated error control coding scheme that can be used on periodically blocked channels such as those subjected to rotating helicopter blades or similar obstacles of periodic nature.

In view of the state of the known technology, one aspect of the present disclosure is to provide a method for improving communication throughput when experiencing periodic blockages, The method includes reading a plurality of data elements into an interleaver in one of a quasi-reverse order and a consecutive order, reading the plurality of data elements out of the interleaver in the other of the quasi-reverse order and the consecutive order, and transmitting the plurality of data elements via a communication channel that experiences periodic blockages.

Another aspect of the present disclosure is to provide another method for improving communication throughput when experiencing periodic blockages. The method includes encoding a plurality of data. elements with an outer encoder, reading the plurality of data elements into or out of a plurality of rows of an interleaver in a quasi-reverse order, and encoding a plurality of data elements with an inner encoder.

Another aspect of the present disclosure is to provide another method for improving communication throughput when experiencing periodic blockages. The method includes decoding a plurality of data elements with an inner decoder, reading the plurality of data elements into or out of a plurality of rows of a deinterleaver in a quasi-reverse order, and decoding the plurality of data elements with an outer decoder.

Another aspect of the present disclosure is to provide another method for improving communication throughput when experiencing periodic blockages. The method includes generating an outer code block to have a bit node degree greater than 7, the bit node degree being a number of parity check equations involving a bit, reading a plurality of data. elements from the outer code into an interleaver, and transmitting the plurality of data elements via a communication channel that experiences periodic blockages.

Another aspect of the present disclosure is to provide another method for improving communication throughput when experiencing periodic blockages. The method includes encoding a plurality of bits with an outer encoder, placing the encoded plurality of bits into one or more groups of M bits, shifting each successive M-bit group by one or more bits, and reading the shifted M-bit groups into an interleaver.

Also, other objects, features, aspects and advantages of the disclosed systems and methods will become apparent to those skilled in the art in the field of satellite communication terminals from the following detailed description, which, taken in conjunction with the annexed drawings, discloses preferred embodiments of a communication terminal, system and method with various features.

BRIEF DESCRIPTION OF THE DRAWINGS

Referring now to the attached drawings which form a part of this original disclosure:

FIGS. 3A and 3B illustrate an example embodiment of an interleaver and a deinterleaver being read in and out without using the coding scheme of the present disclosure;

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

Figure 1:
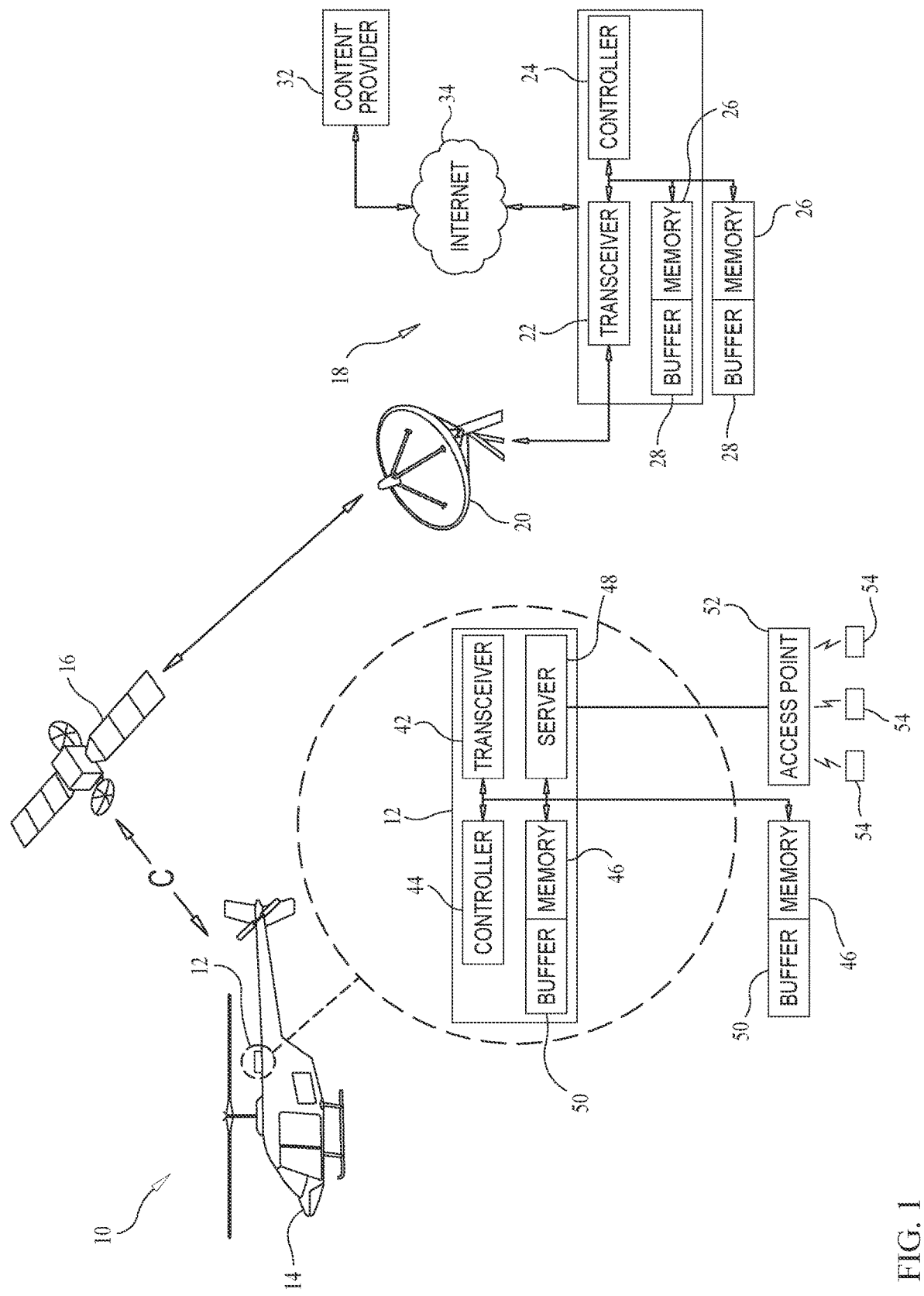
FIG. 1 illustrates an example embodiment of a communication system in accordance with the present disclosure.

FIG. 1 illustrates an example embodiment of a communication system 10 in accordance with the present disclosure. The system 10 includes at least one communication terminal 12. In the illustrated embodiment, the communication terminal 12 is a portable satellite terminal installed on a helicopter 14. In the illustrated embodiment, the system 10 further includes at least one satellite 16 and at least one gateway 18. The communication terminal 12, the satellite 16 and the gateway 18 typically communicate with each other over a radio frequency link, such as a Ku-band link, a Ka-band link, an L bank link, an S band link or any other suitable type of link as understood in the art. The communication terminal 12 is configured to communicate with the gateway 18 via the satellite 16. Likewise, the gateway 18 is configured to communicate with the communication terminal 12 via the satellite 16.

As illustrated, the helicopter 14 includes a rotor with several blades which can interrupt the line of communication C between the communication terminal 12 and the satellite 16 each time a blade crosses the line of communication C. The rotation of the blades therefore causes periodic blockages (e.g.. repeated temporary interruptions) in the ability of the communication terminal 12 to send and/or receive data. The blockage periods are relatively short and can vary, for example, depending on the width of the blades, the distance between the rotor and the communication terminal 12, the azimuth and elevation angle of the satellite 16, the clearance height between the communication terminal 12 and the blades, the speed of the rotor, and/or other factors. Data packets transmitted during a blockage can be either completely lost or severely attenuated. The present disclosure provides systems and methods for dealing with such periodic blockages The communication terminal 12 can also be installed on other vehicles or structures or at other locations that experience periodic blockages due to factors other than rotating blades.

In the illustrated embodiment, the gateway 18 is configured to process data received from the communication terminal 12 via the satellite 16. The gateway 18 can include an antenna dish 20, a transceiver 22, a controller 24, one or more memory 26 and other types of equipment (not shown) such as amplifiers, waveguides and so on as understood in the art which enable communication between gateways 18 and communication terminals 12 via one or more of the orbiting satellites 16. A transceiver 22 can include, for example, an integrated satellite modem and any other suitable equipment which enables the transceiver 22 to communicate with one or more of orbiting satellites 16 as understood in the art. As understood in the art, the controller 24 preferably includes a microcomputer with a control program that controls the gateway 18 as discussed herein. The controller 24 can also include other conventional components such as an input interface circuit, an output interface circuit, and storage devices such as a ROM (Read Only Memory) device and a RAM (Random Access Memory) device. The RAM and ROM store processing results and control programs that are run by the controller 24. The controller 24 is operatively coupled to the components of the gateway 18 as appropriate, in a conventional manner. It will apparent to those skilled in the art from this disclosure that the precise structure and algorithms for the controller 24 can be any combination of hardware and software that will carry out the functions of the present disclosure. The one or more memory 26 can be, for example, an internal memory in the gateway 18, or other type of memory devices such as flash memory or hard drives with an external high speed interface such as a USB bus or an SATA bus, or remote memories such as cloud storage and so on. These other types of memory can be present at the gateway 18 or accessible at a location apart from the gateway 18 via a network connection such as an Ethernet connection, WiFi connection or any other suitable type of connection as understood in the art. Also, the memory 26 can include at least one buffer 28 which is configured to buffer, for example data transmitted to or from a memory 26.

In an embodiment, gateway 18 can include or be configured as an inroute group manager, which can be configured to control the bandwidth allocations to the communication terminals 12 (e.g., on an inroute or inroute group basis), and to correspondingly control and administer the bandwidth allocation approaches. Also, one or more gateway 18 can include or be configured as a network management system, which, among other things, operates to communicate with remote sites, such as web content providers 32, via the Internet 34, cloud storage, or other communication networks as understood in the art. In addition, the gateways 18 can communicate with each other via, for example, the Internet 34 or other communication networks.

In the illustrated embodiment, the communication terminal 12 includes a transceiver 42, a controller 44, one or more memory 44, a local server 48 and other types of equipment (not shown) such as amplifiers, waveguides and so on as understood in the art which enable communication between communication terminals 12 and gateways 18 via one or more of the orbiting satellites 16. A transceiver 42 can include, for example, an integrated satellite modem and any other suitable equipment which enables the transceiver 42 to communicate with one or more of the orbiting satellites 16 as understood in the art. As understood in the art, the controller 44 preferably includes a microcomputer with a control program that controls the communication terminal 12 as discussed herein. The controller 44 can also include other conventional components such as an input interface circuit, an output interface circuit, and storage devices such as a ROM (Read Only Memory) device and a RAM (Random Access Memory) device. The RAM and ROM store processing results and control programs that are run by the controller 44. The controller 44 is operatively coupled to the components of the communication terminal 12 as appropriate, in a conventional manner, It will be apparent to those skilled in the art from this disclosure that the precise structure and algorithms for the controller 44 can be any combination of hardware and software that will carry out the functions of the present disclosure. The one or more memory 46 can be, for example, an internal memory in the communication terminal 12, or other type of memory devices such as a flash memory or hard drives with an external high speed interface such as a USB bus or an SATA bus, or remote memories such as cloud storage and so on. These other types of memory can be present at the communication terminal 12 or accessible at a location apart from the communication terminal 12 (e.g., elsewhere on the helicopter 14) via a network connection such as an Ethernet connection, a WiFi connection or any other suitable type of connection as understood in the art. Moreover, the one or more memory 46 can include at least one buffer 50 which is configured to buffer, for example, data transmitted to or from a memory 46.

In an embodiment, the local server 48 is configured to enable local communication. The local server 48 can also include or communicate with an access point 52, such as a wireless application protocol (WAP) or any other suitable device, which enables the local server 48 to send and receive data to and from other devices 54. The other devices 54 can include, for example, equipment on the helicopter 14 or user devices such as desktop computers, laptop or notebook computers, tablets (e.g., iPads), smart phones, or any other suitable devices as understood in the art. The communications between the local server 48, the access point 52 and the other devices 54 can occur over wireless connections, such as WiFi connections, as well as wired connections as understood in the art.

The transmissions to and/or from the communication terminal 12 are burst-mode transmissions wherein a data stream is segmented into data packets having a fixed size, The packet size can vary. The packets are of a size reflecting a fraction of the transmission duration that is free of any blockage from helicopter blades or other obstructions. If the size of a packet is larger than the blockage-free duration of transmissions, then every packet will be partially blocked or attenuated. With respect to the duration of the blockage from a blade, there is a tradeoff between packet size and data loss. For increased efficiency, the packet should also be of a size smaller than the duration of the blockage. Where the packet size is smaller than the blockage duration, because the packets and the blades are not synchronized, a blade will generally block two packets partially, with possibly one or more completely blocked packets between the two partially blocked packets. Accordingly, longer packets effectively cause increased data loss, because a partially blocked packet is treated in the same manner as a fully blocked packet. On the other hand, while a very short packet size would reduce this loss in efficiency, each packet introduces overhead (e.g., processing overhead) and inefficiencies resulting therefrom.

Figure 2:
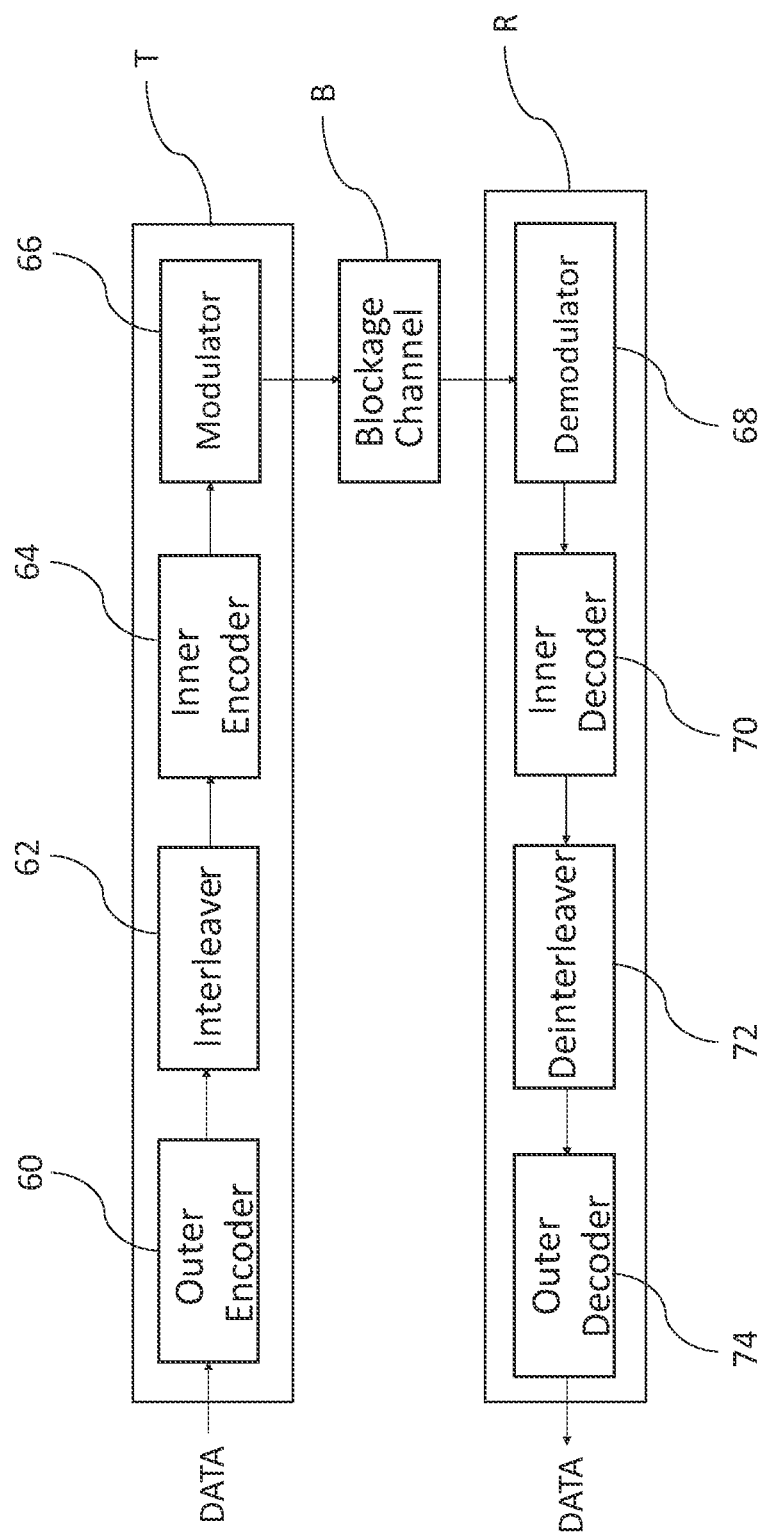
FIG. 2 illustrates a block diagram of an example embodiment of a transmitter and receiver configured to operate in the system of FIG. 1.

FIG. 2 illustrates a block diagram of an example transmitter T and receiver R configured to operate in the system 10 shown in FIG. 1. Each of the communication terminal 12 and the gateway 18 can include a transmitter T and a receiver R. During a particular data transmission from the perspective of FIG. 2, the communication terminal 12 includes one of the transmitter T and receiver R (e.g., at the transceiver 42), and the gateway 18 includes the other of the transmitter T and receiver R (e.g., at the transceiver 22), depending on whether the data transmission is to or from the communication terminal 12. The blockage channel B represents the communication channel that experiences blockage, for example, due to the rotation of helicopter blades. In the illustrated embodiment, the transmitter I includes an outer encoder 60, an interleaver 62, an inner encoder 64 and a modulator 66, while the receiver R includes a demodulator 68, an inner decoder 70, a deinterleaver 72, and an outer decoder 74.

At the transmission side, the outer encoder 60 receives data from a data source. For example, the data can come from equipment on the helicopter 14 or other devices 54. The data is segmented into a plurality of data elements, for example, which can include bits or bytes of data. The outer encoder 60 can apply a parity check coding as an outer code and generate one or more outer code block. The size of the outer code block is fixed. For example, the size of the outer code block can be 13400 bits or 67200 bits. The outer code block can have a plurality of rows and a plurality of columns.

The interleaver 62 includes a plurality or rows and a plurality of columns. In an embodiment, the total size of the interleaver 62 is selected based on the period of the blockage channel. More specifically, the total size of the rows and/or columns of the interleaver 62 is selected to be approximately equal to the period between the periodic blockages. This time span may correspond to more than one inner or outer code blocks. The number of data elements (e.g., bits) in each row of the interleaver 62 can be chosen to be similar to one inner code input block size.

The data elements are read into the interleaver 62 from the outer encoder 60. More specifically, the data elements are read into the interleaver row-by-row. In an embodiment, the data elements are read into the interleaver 62 row-by-row by reading down a column of the outer code block into a row of the interleaver 62. In an embodiment, the data elements are read into the interleaver 62 row-by-row and read out column-by-column.

The data elements are read out of the interleaver 62 to the inner encoder 64. In an embodiment, the data elements are read out of the interleaver 62 column-by-column. The inner encoder 64 encodes each packet with an FEC code as an inner code (e.g, LDPC) as understood in the art.

The modulator 66 receives data elements from the inner encoder 64 and modulates the data elements for transmission to the receiver R. The data elements are then transmitted through the blockage channel B to the receiver R so that the receiver R can essentially perform the reverse process of the transmitter T. At the receiver R, the demodulator 68 demodulates the received transmission to retrieve the transmitted data elements.

The inner decoder 70 attempts to decode each data packet. If the inner code is an LDPC code, the parity check equations of the inner decoder indicate whether a particular kind of packet has been correctly decoded or not. For other kinds of inner codes, such as turbo or convolutional codes, or for the case where there is no code, CRC bits can be used to determine whether each packet is successfully received.

The deinterleaver 72 deinterleaves the data elements to present them to the outer decoder 74 in the initial column-by-column order used by the outer encoder 60. In an embodiment, the total size of the deinterleaver 72 is selected based on the period of the blockage channel. More specifically, the total size of the rows and/or columns of the deinterleaver 72 is selected to be approximately equal to the period between the periodic blockages. This time span may correspond to more than one inner or outer code blocks. The number of data elements (e.g., bits) in each row of the deinterleaver 72 can be chosen to be similar to one inner code input block size. In an embodiment, the size of the deinterleaver 72 is the same as the size of the interleaver 62.

The data elements are read into the deinterleaver 72 from the inner encoder 70. More specifically, the data elements are read into the deinterleaver column-by-column.

The data elements are read out of the deinterleaver 72 to the outer decoder 74. In an embodiment, the data elements are read out of the deinterleaver 72 row-by-row.

The interleaver 62 (and/or deinterleaver 72) between the inner and outer codes is crucial to the performance of the entire concatenated system. On a periodically blocked channel, only some of the inner code blocks are erased. The interleaver 62 distributes the erased bits of the affected inner code blocks as uniformly as possible among the outer code blocks.

There are various ways to implement the interleaver 62. FIG. 3A and 3B illustrate simple diagram of an interleaver and deinterleaver being read in and out without using the coding scheme of the present disclosure FIG. 4A and 4B illustrate an example embodiment of an interleaver 62 and a deinterleaver 72 being read in and out in accordance with an example embodiment of the coding scheme of the present disclosure.

in FIG. 3A, data elements (d1, d2, d3, etc.) are written into an interleaver by filling each row consecutively (i.e., across row R0, across row R1, across row R2), and the data elements are read out of the interleaver by reading out each column consecutively (i.e., down column C0, down column C1, down column C2). In FIG. 3B, the data elements are then later written into a deinterleaver by filling each column consecutively (i.e., down column C0, down column C1, down column C2), and the data elements are read out of the deinterleaver by reading out each row consecutively (i.e., across row R0, across row R1, across row R2). The order of data elements read out of the deinterleaver therefore corresponds to the order of data read into the interleaver.

Figure 4A:
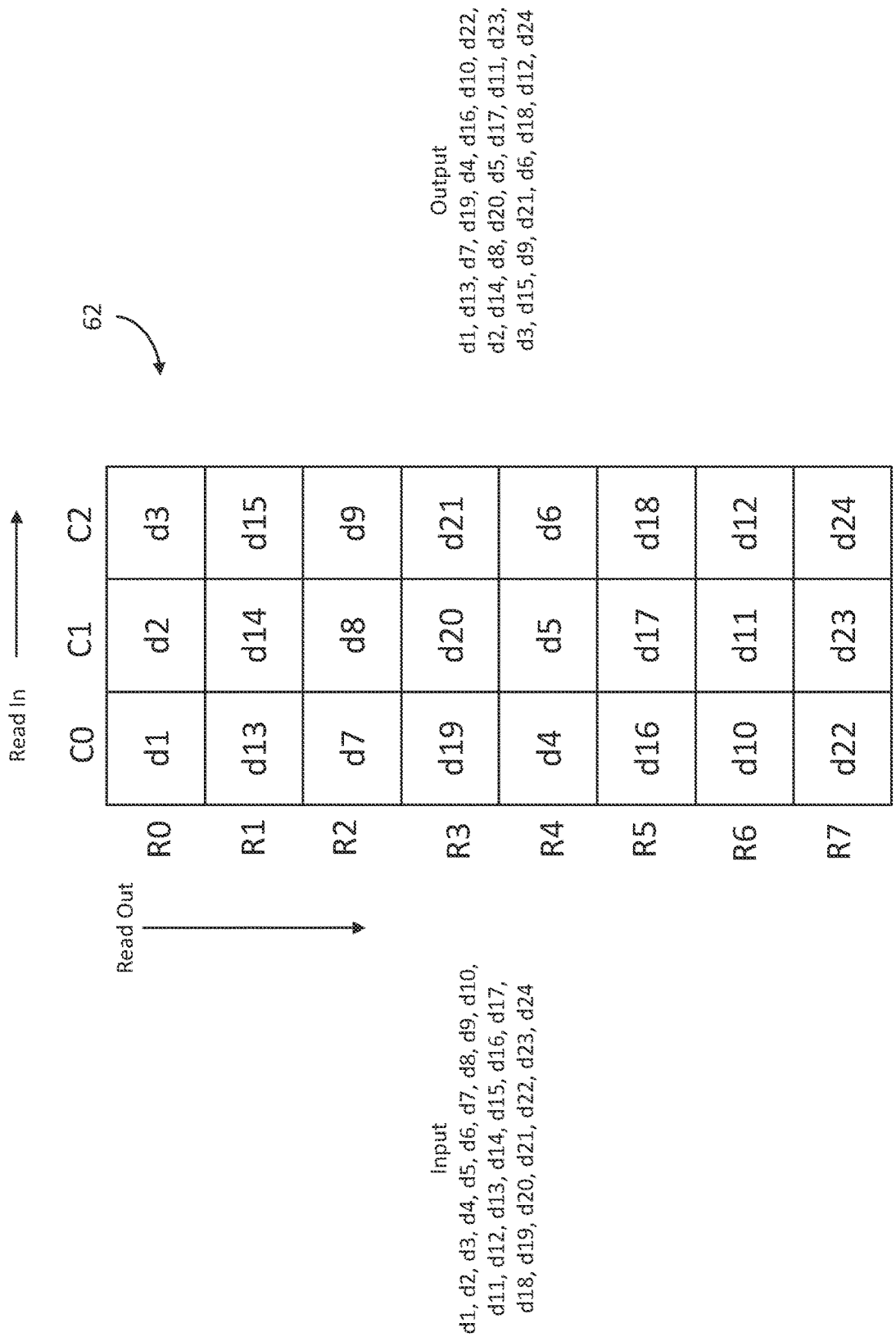
FIGS. 4A and 4B illustrate an example embodiment of an interleaver and a deinterleaver being read in and out using the coding scheme of the present disclosure.
Figure 4B:
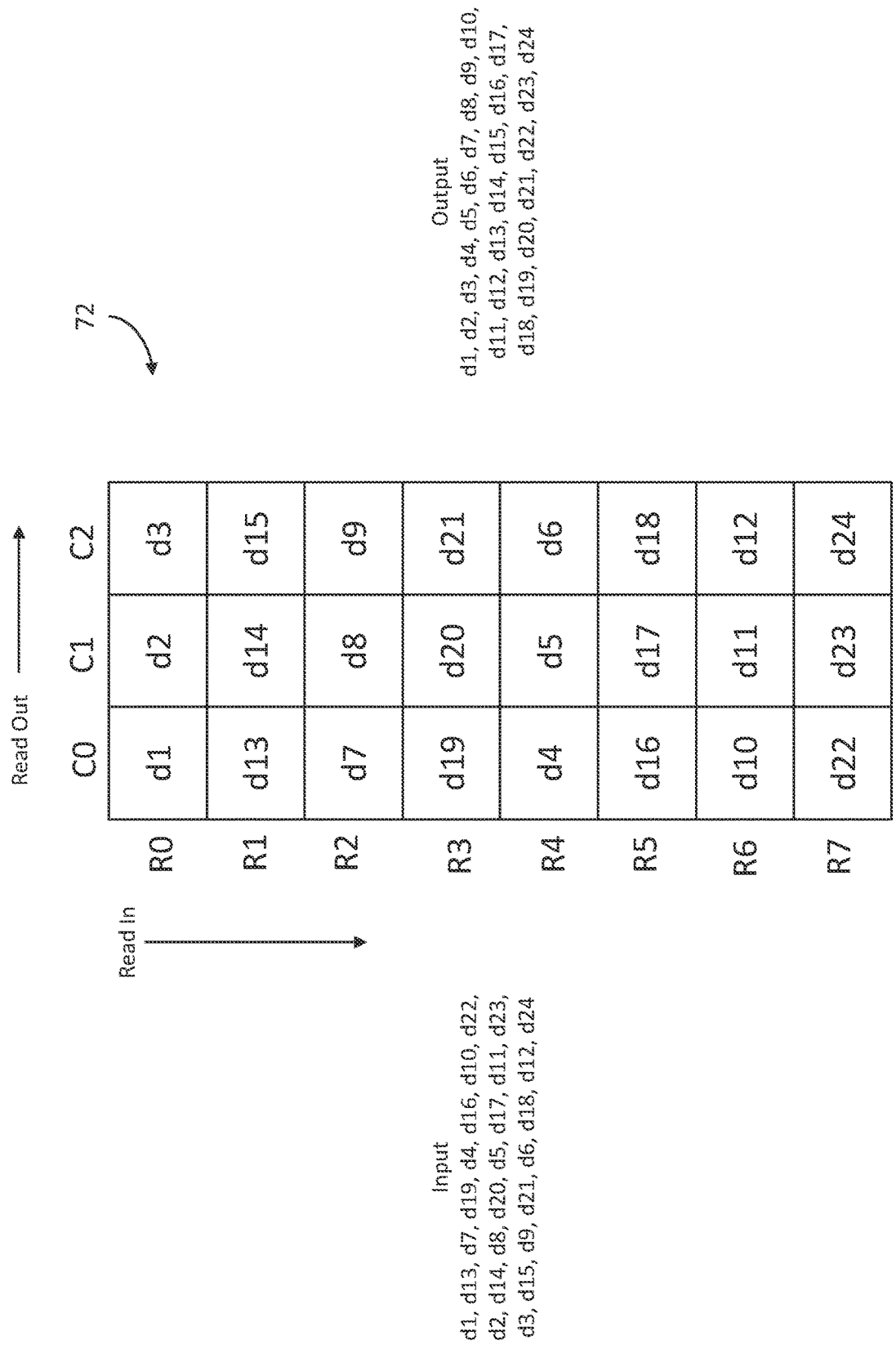

In FIG. 4A, data elements are read into the interleaver 62 using a quasi-reverse order according to the present disclosure. As illustrated, data elements (d1, d2, d3, etc.) are written into an interleaver 62 by filling each row in the quasi-reverse order (across row R0, across row R4, across row R2, across row R6, across row R1, across row R5, across row R3, across row R7), and the data elements are read out of the interleaver 62 by reading out each column consecutively (down column C0, down column C1, down column C2). In FIG. 4B, the data elements are then later written into a deinterleaver 72 by filling each column consecutively (down column C0, down column C1, down column C2), and the data elements are read out of the deinterleaver 72 by reading out each row using the quasi-reverse order (across row R0, across row R4, across row R2, across row R6, across row R1, across row R5, across row R3, across row R7). The order of data read out of the deinterleaver 72 therefore corresponds to the order of data read into the interleaver 62. The quasi-reverse order shown in FIG. 4A and 4B is advantageous when dealing with periodic blockages because it prevents consecutive inner blocks from being erased during transmission.

Using the example of FIG. 4A, there are several ways to define the quasi-reverse order. In this example, the interleaver has X rows, with X=7 and including row 0. When the data elements are written across rows in the quasi-reverse order, the data elements are written into rows by alternating between writing to a row in the first half of the rows (e.g., less than X/2 (rows R0-R3)) and writing to a row in the second half of the rows (e.g., greater than X/2 (rows R4-R7)). As illustrated, in an embodiment, quasi-reverse order does not write to consecutive rows. As illustrated, in an embodiment, quasi-reverse order skips at least one row when moving from a previous row to a next row. As, illustrated, in an embodiment, the quasi-reverse order alternates between writing to an earlier row (<X) and then writing to a later row (>X). Those of ordinary skill in the art will recognize from this disclosure that there are various alternative ways for implementing the quasi-reverse order.

Figures 5, 6:
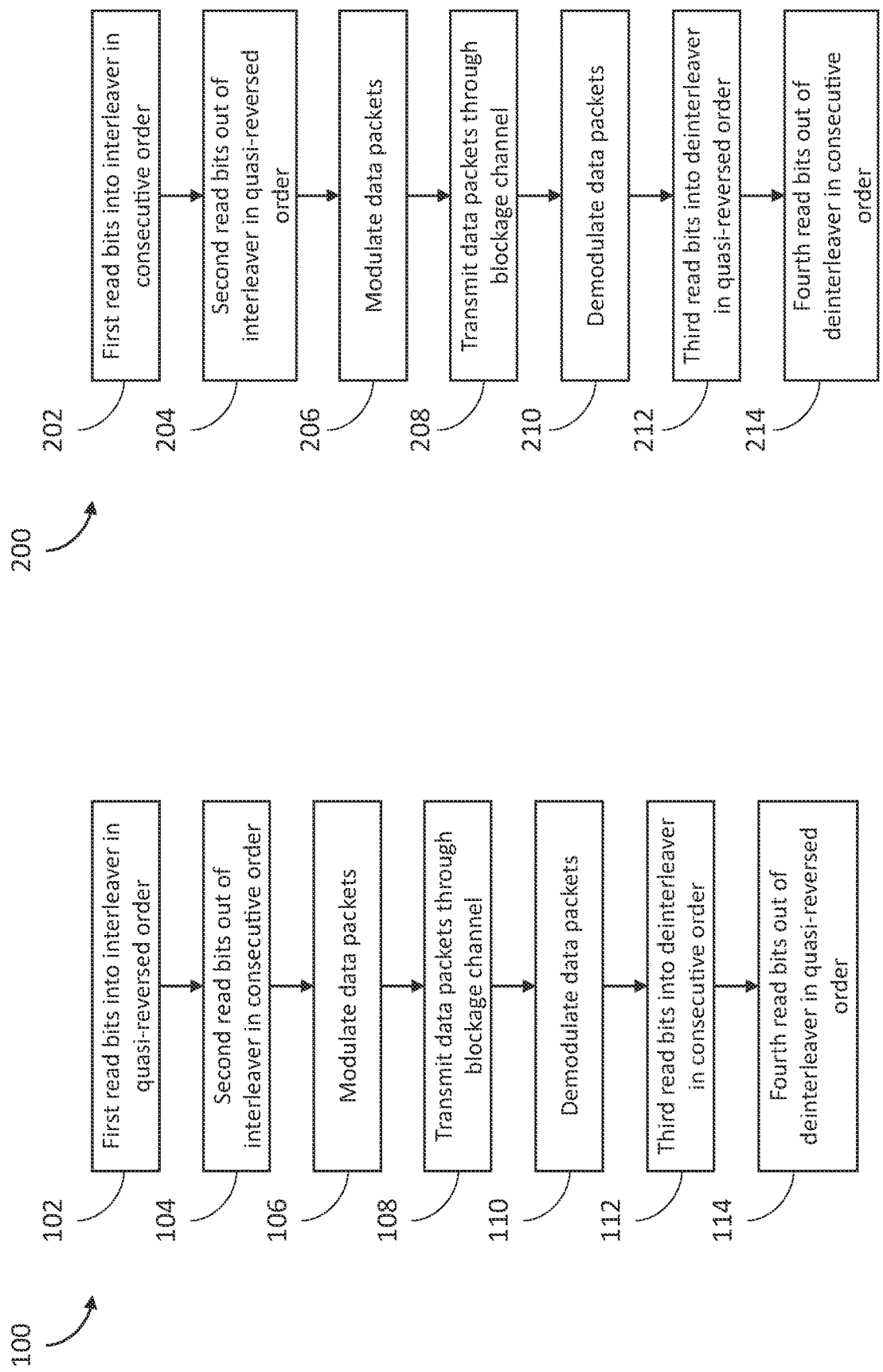
FIG. 5 illustrates an example embodiment of a method according to the present disclosure which can be performed by the system of FIG. 1.
FIG. 6 illustrates another example embodiment of a method according to the present disclosure which can be performed by the system of FIG. 1.

FIGS. 5 and 6 illustrate example embodiments of methods 100, 200 which read data elements into or out of the interleaver 62 in a quasi-reverse order to improve communication throughput in accordance with the present disclosure.

FIG. 5 illustrates an example embodiment of a method 100 for improving communication throughput in accordance with the present disclosure. Specifically, FIG. 5 illustrates an example embodiment of a method 100 which reads data elements into the interleaver 62 in a quasi-reverse order. The steps of the method 100 can be executed by a controller 24, 44, for example, by being stored as instructions on its memory and executed by its processor. It should be understood that some of the steps described herein can be reordered or omitted without departing from the spirit or scope of the method 100.

At step 102, the data elements (e.g., bits) are read into the interleaver 62. Here the data elements are read into the interleaver 62 in the quasi-reverse order that prevents consecutive inner blocks from being erased during transmission. For example, if the interleaver has 8 rows, it can be filled in the row order 0, 4, 2, 6, 1. 5, 3, 7 in accordance with the quasi-reverse order (e.g., as shown in FIG. 4A). When the number of rows is not a power of two, a similar order can be chosen. For example with 10 rows, the interleaver 62 can be filled in the row order 0, 5, 2, 7, 4, 9, 1, 6, 3, 8, This separates potentially erased bits as much as possible when they are read out column-by-column from the interleaver 62, even when two consecutive inner blocks are erased. The size of the interleaver 62 does not have to be an integer multiple of the inner code input block size or the outer code output block size; the leftover bits of the inner or outer code blocks can simply continue to be interleaved/deinterieaved in the following interleaver block.

At step 104, the data elements are read out of the interleaver 62. More specifically the data elements are read out of the interleaver 62 in consecutive order. Since the data elements have been read into the interleaver 62 in the quasi-reverse order, reading the data elements out of the interleaver 62 in consecutive order separates potentially erased bits as much as possible.

At step 106, the modulator 66 modulates data elements for transmission, for example as understood in the art. For example, at the communication terminal 12, the modulator 66 modulates the data elements for transmission to the satellite 16 and then from the satellite 16 to the gateway 18. Likewise, at the gateway 18, the modulator 66 modulates the data elements for transmission to the satellite 16 and then from the satellite 16 to the communication terminal 12.

At step 108, the data elements are transmitted through a blockage channel. The blockage channel can be a line of communication that is interrupted by rotating helicopter blades as illustrated in FIG. 1. Since the data elements have been separated as much as possible, consecutive inner blocks are not erased during transmission.

At step 110, the demodulator 68 demodulates the received transmission to retrieve the transmitted data elements. The demodulator 68 demodulates the received transmission, for example, as understood in the art.

At step 112, the data elements are read into the deinterleaver 72. Here the data elements are read into the deinterleaver 72 in consecutive order e.g., as shown in FIG. 4B). The data elements are read into the deinterleaver 72 in the consecutive order because they were previously read out of the interleaver 62 in the consecutive order.

At step 114, the data elements are read out of the deinterleaver 72. More specifically, the data elements are read out of the deinterleaver 72 in the quasi-reverse order used at step 102 (e.g., as shown in FIG. 4B). This way, the data elements are placed in the original order from the outer encoder 60 prior to being read into the interleaver 62.

FIG. 6 illustrates another example embodiment of a method 200 for improving communication throughput in accordance with the present disclosure. Specifically, FIG. 6 illustrates an example embodiment of a method 200 which reads data elements out of the interleaver 62 in a quasi-reverse order. The steps of the method 200 can be executed by a controller 24, 44, for example, by being stored as instructions on its memory and executed by its processor. It should be understood that some of the steps described herein can be reordered or omitted without departing from the spirit or scope of the method 200.

At step 202, the data elements are read into the interleaver 62. Here the data elements are read into the interleaver 62 in consecutive order.

Figure 7A:
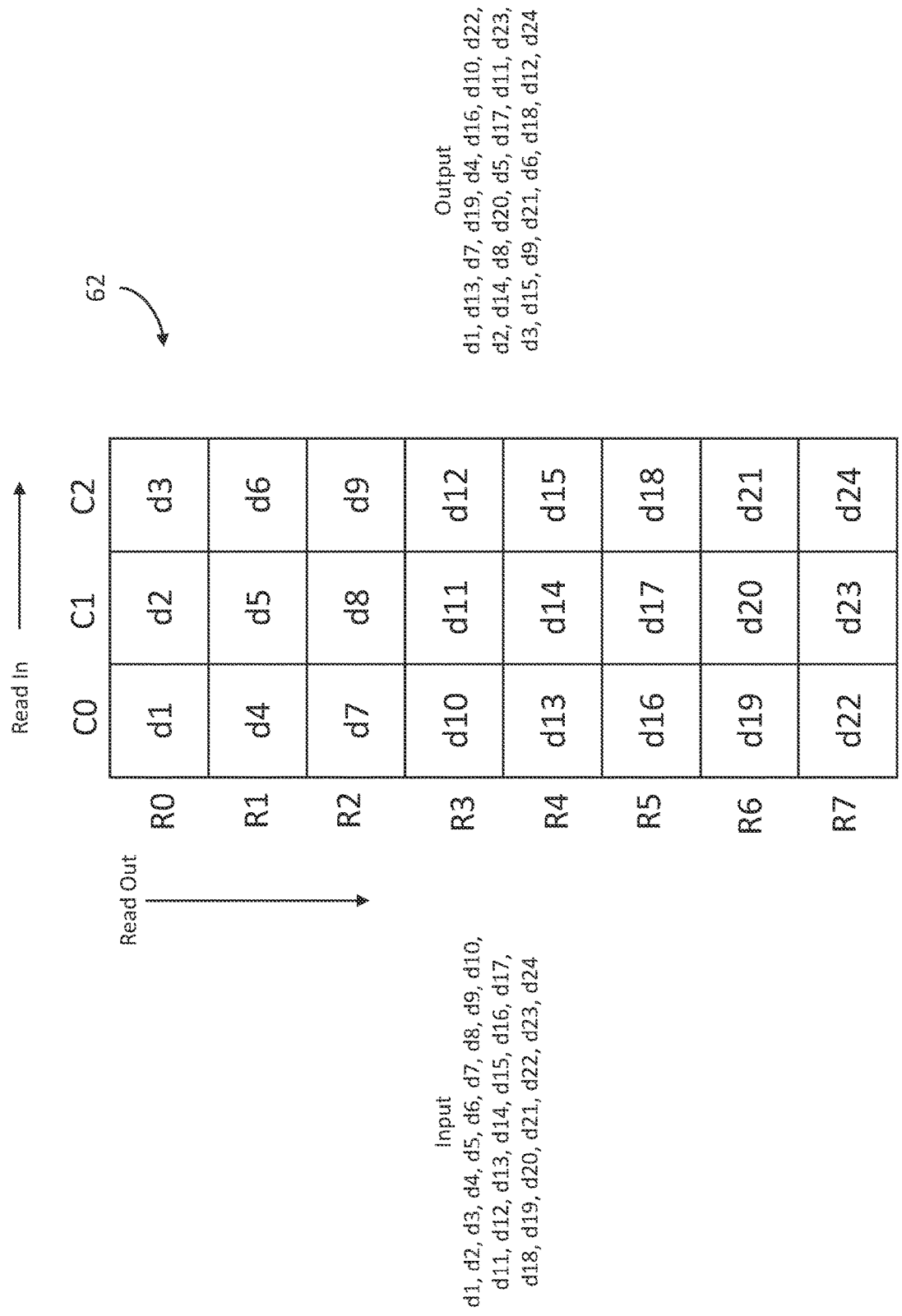
FIGS. 7A and 7B illustrate an example embodiment of an interleaver and a deinterleaver being read in and out using the coding scheme of the present disclosure.

At step 204, the data elements are read out of the interleaver 62. More specifically, the data elements are read out of the interleaver 62 in the quasi-reverse order that prevents consecutive inner blocks from being erased during transmission. For example, if the interleaver has 8 rows, it can be read out in the row order 0, 4. 2, 6, 1, 5, 3, 7 in accordance with the quasi-reverse order (e.g., for each column as shown in FIG. 7A: row R0, row R4, row R2, row R6, row R1, row R5, row R3, row R7).

At step 206, the modulator 66 modulates the data elements for transmission, for example as understood in the art. For example, at the communication terminal 12, the modulator 66 modulates the data elements for transmission to the satellite 16 and then from the satellite 16 to the gateway 18. Likewise, at the gateway 18, the modulator 66 modulates the data elements for transmission to the satellite 16 and then from the satellite 16 to the communication terminal 12.

At step 208, the data elements are transmitted through a blockage channel. The blockage channel can be a line of communication that is interrupted by rotating helicopter blades as illustrated in FIG. 1. Since the data elements have been separated as much as possible, consecutive inner blocks are not erased during transmission.

At step 210, the demodulator 68 demodulates the received transmission to retrieve the transmitted data elements. The demodulator 68 demodulates the received transmission, for example, as understood in the art.

Figure 7B:
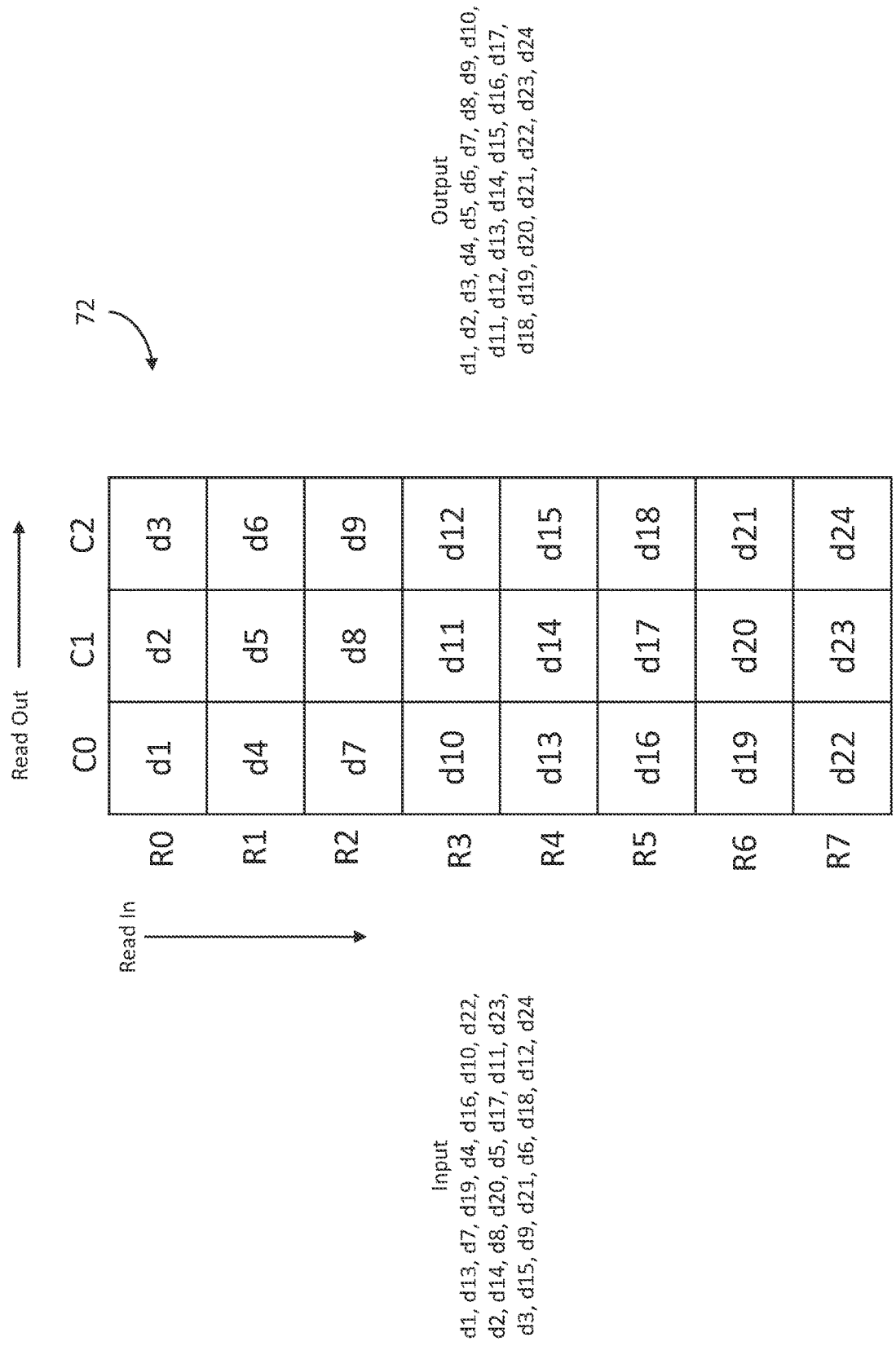

At step 212, the data elements are read into the deinterleaver 72. Here the data elements are read into the deinterleaver 72 in the quasi-reverse order used at step 202 (e.g., for each column as shown in FIG. 7B: row R0, row R4, row R2, row R6, row R1, row R5. row R3, row R7). The data elements are read into the deinterleaver 72 in the quasi-reverse order because they were previously read out of the interleaver 62 in the quasi-reverse order.

At step 214, the data elements are read out of the deinterleaver 72. More specifically, the data elements are read out of the deinterleaver 72 in the consecutive order used at step 202 (e.g., as shown in FIG. 7B). This way, the data elements are placed in the original order from the outer encoder 60 prior to being read into the interleaver 62.

Those of ordinary skill in the art will recognize from this disclosure that, in an embodiment, the rows and columns can be swapped so that the data is read into the interleaver 62 column-by-column and read out row-by-row. There are various ways to perform the methods of the present disclosure as long as the deinterleaver 72 is read in and out using the opposite process of the interleaver 62 and the quasi-reverse order is used on the columns/rows of one of the read in/out for the interleaver and the other of the read in/out for the deinterleaver 72.

In an embodiment, the combination of the interleaver 62 and the periodic blade blockage can introduce erasures at intervals that can become detrimental to the code correction capability. An example of periodic erasures that would reduce the code correction capability is when erasures occur at an M bit interval. Further, for interleavers 62 that are implemented as bytes rather than as bits, it can be beneficial to spread the bits farther apart than within a cluster of bits of a byte.

In an embodiment, to avoid the periodic erasures at an M interval caused by the blade blockage relative to the interleaver 62 duration, the system 10 puts encoded bits into a group of M bits and shifts each successive M-bit parallelism group g by s bits. Bit-to-byte local interleaving can follow to spread out the erasures within a byte when erasures occur in a cluster of bytes rather than in separate bits.

Figure 8:
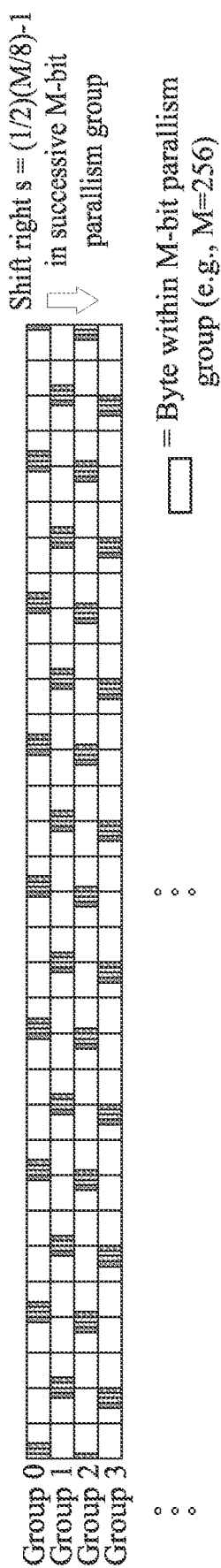
FIG. 8 illustrates an example of bit shifting in accordance with the present disclosure.
Figure 9:
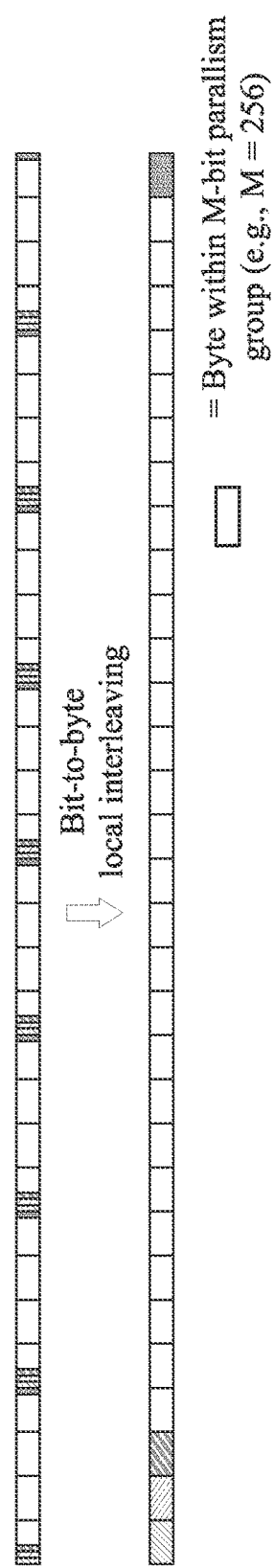
FIG. 9 illustrates an example of bit-to-byte local interleaving in accordance with the present disclosure.

For bit b within M-bit parallelism group g, the encoded bit position after shifting s bit position on successive parallelism group g would map as follows:

$$b+Mg \rightarrow (b+sg)\%M+Mg$$

for b=0 . . . M−1; g=0 . . . 524; and M={128, 256}. The operator "%" is the modulo operator, An example of bit shifting is shown in FIG. 8. More specifically, FIG. 8 shows an example of bit shifts on successive Mbit parallelism group g, with s=(1/2)(M/8)−1. After the bit shifting, the bit-to-byte interleaving would be performed on each M-bit parallelism group g.

$$(8y'+b')+Mg \rightarrow (M/8)b'+y')+Mg$$

for b'=0 . . . 7 and y'=0 . . . ((M/8)−1). An example of the bit-to-byte local interleaving is shown in FIG. 9. The output of the local interleaving is sent to the interleaver 62, At the receiver, the opposite actions of byte-to-bit local deinterleaving and of bit reverse-shifting are performed.

In an embodiment, the system 10 performs the above process at the transmitter T between the outer encoder 60 output and the interleaver 62 input. The system 10 then performs the opposite process at the receiver R to reverse the action between the deinterleaver 72 output and the outer decoder 74 input. Thus, in an embodiment, a method for improving communication throughput when experiencing periodic blockages includes encoding a plurality of bits with the outer encoder 60, placing the encoded plurality of bits into one or more groups of M bits, shifting each successive M-bit group by one or more bits, and reading the shifted M-bit groups into the interleaver 62.

With the systems and method of the present disclosure, both inner and outer codes can be LDPC codes. On the other hand, their degree distributions are separately optimized for their respective use: inner codes are optimized to improve their performance in an Additive White Gaussian Noise (AWGN) channel, whereas outer codes are optimized to improve their performance in an erasure channel. Table 1 shows the bit node degree distribution of the outer codes for different code rates and block sizes. The check node degrees are as follows for all the nodes except for one check node with 1 less degree: 23 for rate 4/5, 17 for rate 19/25, 14 for rate 5/7, 12 for rate 2/3, 10 for rate 3/5, 7 for rate 2/5, and 5 for rate 1/3. The parity check matrices for all the codes are given in Tables 3 through 16 of U.S. Provisional Application No. 63/301,835 and are incorporated herein by reference. $j^{th}$ row in the Tables represents the column indices where the parity check matrix has an entry of 1 in (j×M)th row, where NI values are given in Table 2 (here j starts counting from 0.) For example looking at Table 11, the $128^{th}$ row of the parity check matrix has an entry of 1 in the following column indices: 2521 8724 16969 27271 27899 33730 35892 36325 40320 40448. The rest of the column indices in that row are all 0's. For the remaining rows j×M+i (i=1,2,3, . . . , M−1) of the parity check matrix, the column indices with an entry of 1 are given by $(x+i)-(\lfloor(x+i)/M\rfloor-\lfloor x/M \rfloor) \times M$ where x is a column index with an entry of 1 in the (j×M)th row of the parity check matrix, and $\lfloor . \rfloor$ is the floor function. An exception to the above rule is in the $0^{th}$ row of the Tables 3 through 16 of U.S. Provisional Application No. 63/301,835. In this case, for all of the $i^{th}$ (i=1,2, 3, . . . , M−1) rows in the parity check matrix, there is an extra element given by N−M−1+i.

In Table 1, the outer code is designed to correct erasures by having certain bits occur in a large number of parity equations. More specifically, the outer code is designed to have a bit node degree greater than 7. The bit node degree is the number of parity check equations that involve a bit. For example, in Table 1, each of the codes has a bit node degree of at least 13, 14, 18 or 33. R is the code rate and N is the codeword size. R=4/5 has a bit node degree of 18. R=19/25 has a bit node degree of 14. R=5/7 has a bit node degree of 14. R=2/3 has a bit node degree of 13. R=3/5 has a bit node degree of 14. R=2/5 has a bit node degree of 33. R=1/3 has bit node degrees of 13 and 14.

It is assumed that if a non-negligible part of the inner codeword is blocked (e.g. by a helicopter blade), the whole codeword is erased. This is a reasonable assumption, because if there are a sufficient number of blocked bits, they "infect" other bits through iterative decoding in the code's Tanner graph.

TABLE 1

Bit Node Degrees for Erasure Correcting Codes

| Code/Bit Node Degrees | 33 | 18 | 14 | 13 | 7 | 6 | 4 | 3 | 2 | 1 |
|---|---|---|---|---|---|---|---|---|---|---|
| R = 4/5, N = 67200 | | 8064 | | | | | | 45696 | 13439 | 1 |
| R = 4/5, N = 134400 | | 16128 | | | | | | 91392 | 26879 | 1 |
| R = 19/25, N = 67200 | | | 8064 | | | | | 43008 | 16127 | 1 |
| R = 19/25, N = 134400 | | | 16128 | | | | | 86016 | 32255 | 1 |
| R = 5/7, N = 67200 | | | 7680 | | | | 1920 | 38400 | 19199 | 1 |
| R = 5/7, N = 134400 | | | 15360 | | | | 3840 | 76800 | 38399 | 1 |
| R = 2/3, N = 67200 | | | | 8960 | | | | 35840 | 22399 | 1 |
| R = 2/3, N = 134400 | | | | 17920 | | | | 71680 | 44799 | 1 |
| R = 3/5, N = 67200 | | | 8064 | | | | 5376 | 26880 | 26879 | 1 |
| R = 3/5, N = 134400 | | | 16128 | | | | 10752 | 53760 | 53759 | 1 |
| R = 2/5, N = 67200 | 2688 | | | | 8064 | 2688 | | 13440 | 40319 | 1 |
| R = 2/5, N = 134400 | 5376 | | | | 16128 | 5376 | | 26880 | 80639 | 1 |
| R = 1/3, N = 67200 | | | 3200 | 3200 | | | | 16000 | 44799 | 1 |
| R = 1/3, N = 134400 | | | 6400 | 6400 | | | | 32000 | 89599 | 1 |

Table 2 depicts the erasure correcting performance of outer LDPC codes for different code rates and block sizes. In all cases, the erasure correcting capability of the codes are close to the overhead percentage.

TABLE 2

Erasure Correction Capability of the Outer LDPC Codes
(R: code rate, N: codeword size, M: code parallelism)

| R | N | M | Parity Percentage | Erasure Code Capability |
|---|---|---|---|---|
| 4/5 | 67200 | 128 | 20% | 18.3% |
| 4/5 | 134400 | 256 | 20% | 18.4% |
| 19/25 | 67200 | 128 | 24% | 22.2% |
| 19/25 | 134400 | 256 | 24% | 22.3% |
| 5/7 | 67200 | 128 | 28.57% | 26.6% |
| 5/7 | 134400 | 256 | 28.57% | 26.7% |
| 2/3 | 67200 | 128 | 33.33% | 31.3% |
| 2/3 | 134400 | 256 | 33.33% | 31.3% |
| 3/5 | 67200 | 128 | 40% | 37.6% |
| 3/5 | 134400 | 256 | 40% | 37.8% |
| 2/5 | 67200 | 128 | 60% | 57.7% |
| 2/5 | 134400 | 256 | 60% | 58.0% |
| 1/3 | 67200 | 128 | 66.67 | 64.2% |
| 1/3 | 134400 | 256 | 66.67 | 64.2% |

The embodiments described herein provide improved terminals, systems and methods for transmitting data through periodically blocked channels such as those subjected to rotating helicopter blades or similar obstacles of periodic nature, These terminals, systems and methods are advantageous, for example, because they prevent consecutive inner blocks from being erased during transmission. It should be understood that various changes and modifications to the systems and methods described herein will be apparent to those skilled in the art and can he made without diminishing the intended advantages.

Tables 3 through 16 of U.S. Provisional Application No. 63/301,835 cover the following embodiments:
Table 3: Parity Check Matrix for R=4/5, N=67200
Table 4: Parity Check Matrix for R=4/5, N=134400
Table 5: Parity Check Matrix for R=19/25, N=67200
Table 6: Parity Check Matrix for R=19/25, N=134400
Table 7: Parity Check Matrix for R=5/7, N=67200
Table 8: Parity Check Matrix for R=5/7, N=134400
Table 9: Parity Check Matrix for R=2/3, N=67200
Table 10: Parity Check Matrix for R=2/3, N=134400
Table 11: Parity Check Matrix for R=3/5, N=67200
Table 12: Parity Check Matrix for R=3/5, N=134400
Table 13: Parity Check Matrix for R=2/5, N=67200
Table 14: Parity Check Matrix for R=2/5, N=134400
Table 15: Parity Check Matrix for R=1/3, N=67200
Table 16: Parity Check Matrix for R=1/3, N=134400

GENERAL INTERPRETATION OF TERMS

In understanding the scope of the present invention, the term "comprising" and its derivatives, as used herein, are intended to be open ended terms that specify the presence of the stated features, elements, components, groups, and/or steps, but do not exclude the presence of other unstated features, elements, components, groups, integers and/or steps. The foregoing also applies to words having similar meanings such as the terms, "including", "having" and their derivatives. Also, the terms "part," "section," or "element" when used in the singular can have the dual meaning of a single part or a plurality of parts.

The term "configured" as used herein to describe a component, section or part of a device includes hardware and/or software that is constructed and/or programmed to carry out the desired function.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such features. Thus, the foregoing descriptions of the embodiments according to the present invention are provided for illustration only, and not for the purpose of limiting the invention as defined by the appended claims and their equivalents.

What is claimed is:

1. A method for improving communication throughput when experiencing periodic blockages, the method comprising:
    encoding a plurality of data elements with an outer encoder;
    reading the plurality of data elements into or out of a plurality of rows of an interleaver in a quasi-reverse order;
    encoding the plurality of data elements with an inner encoder;
    decoding the plurality of data elements with an inner decoder;
    reading the plurality of data elements into or out of a plurality of rows of a deinterleaver in a quasi-reverse order; and
    decoding the plurality of data elements with an outer decoder.

2. The method of claim 1, wherein
    reading the plurality of data elements into or out of the plurality of rows of the interleaver comprises
        reading the plurality of data elements into the interleaver in the quasi-reverse order, and
        reading the plurality of data elements out of the interleaver in a consecutive order.

3. The method of claim 1, wherein
    reading the plurality of data elements into or out of the plurality of rows of the interleaver comprises
        the first reading reads the plurality of data elements into the interleaver in a consecutive order, and
        the second reading reads the plurality of data elements out of the interleaver in the quasi-reverse order.

4. The method of claim 1, wherein
    reading the plurality of data elements into or out of the plurality of rows of the interleaver comprises reading the plurality of data elements into the plurality of rows of the interleaver in the quasi-reverse order.

5. The method of claim 1, wherein
    reading the plurality of data elements into or out of the plurality of rows of the interleaver comprises reading the plurality of data elements out of the plurality of rows of the interleaver in the quasi-reverse order.

6. The method of claim 1, wherein
    reading the plurality of data elements into or out of the plurality of rows of the interleaver comprises reading the plurality of data elements into or out of the plurality of rows of the interleaver in the quasi-reverse order by alternating between rows in a first half of the plurality of rows and rows in a second half of the plurality of rows.

7. The method of claim 1, wherein
    reading the plurality of data elements into or out of the plurality of rows of the interleaver comprises reading the plurality of data elements into or out of the plurality of rows of the interleaver in the quasi-reverse order by skipping at least one row when moving from a previous row to a next row.

8. The method of claim 1, wherein
    reading the plurality of data elements into or out of the plurality of rows of the interleaver comprises reading the plurality of data elements into or out of the plurality of rows of the interleaver in the quasi-reverse order by alternating between writing to an earlier row and then writing to a later row.

9. The method of claim 1, wherein
    reading the plurality of data elements into or out of the plurality of rows of the deinterleaver comprises reading the plurality of data elements into the plurality of rows of deinterleaver in the quasi-reverse order.

10. The method of claim 1, wherein
    reading the plurality of data elements into or out of the plurality of rows of the deinterleaver comprises reading the plurality of data elements out of the plurality of rows of the deinterleaver in the quasi-reverse order.

11. The method of claim 1, wherein
    reading the plurality of data elements into or out of the plurality of rows of the deinterleaver comprises reading the plurality of data elements into or out of the plurality of rows of the deinterleaver in the quasi-reverse order by alternating between rows in a first half of the plurality of rows and rows in a second half of the plurality of rows.

12. The method of claim 1, wherein
    reading the plurality of data elements into or out of the plurality of rows of the deinterleaver comprises reading the plurality of data elements into or out of the plurality of rows of the deinterleaver in the quasi-reverse order by skipping at least one row when moving from a previous row to a next row.

13. The method of claim 1, wherein
    reading the plurality of data elements into or out of the plurality of rows of the deinterleaver comprises reading the plurality of data elements into or out of the plurality of rows of the deinterleaver in the quasi-reverse order by alternating between writing to an earlier row and then writing to a later row.

* * * * *